United States Patent
Fan et al.

(10) Patent No.: US 10,217,428 B2
(45) Date of Patent: Feb. 26, 2019

(54) OUTPUT CONTROL UNIT FOR SHIFT REGISTER, SHIFT REGISTER AND DRIVING METHOD THEREOF, AND GATE DRIVING DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jun Fan, Beijing (CN); Jie Zhang, Beijing (CN); Fuqiang Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 0 days.

(21) Appl. No.: 15/522,368

(22) PCT Filed: Dec. 11, 2015

(86) PCT No.: PCT/CN2015/097100
§ 371 (c)(1),
(2) Date: Apr. 27, 2017

(87) PCT Pub. No.: WO2017/020472
PCT Pub. Date: Feb. 9, 2017

(65) Prior Publication Data
US 2017/0330526 A1    Nov. 16, 2017

(30) Foreign Application Priority Data
Aug. 6, 2015 (CN) .......................... 2015 1 0477391

(51) Int. Cl.
*G11C 19/00* (2006.01)
*G09G 3/36* (2006.01)
*G11C 19/28* (2006.01)

(52) U.S. Cl.
CPC .......... *G09G 3/3677* (2013.01); *G11C 19/28* (2013.01); *G09G 2300/0426* (2013.01);
(Continued)

(58) Field of Classification Search
None
See application file for complete search history.

(56) References Cited

U.S. PATENT DOCUMENTS 8,379,790 B2 *  2/2013  Tobita .................... G11C 19/28
                                                377/64
8,830,156 B2 *  9/2014  Kim ...................... G09G 3/3677
                                                345/100

(Continued)

FOREIGN PATENT DOCUMENTS

CN       101312019 A      11/2008
CN       102034448 A      4/2011
(Continued)

OTHER PUBLICATIONS

The Second Chinese Office Action dated Sep. 4, 2017; Appln. No. 201510477391.0.
(Continued)

*Primary Examiner* — Tuan T Lam
(74) *Attorney, Agent, or Firm* — Ladas & Parry LLP

(57) ABSTRACT

An output control unit of a shift register, a shift register and a driving method thereof, and a gate driving device. The output control unit includes N pull-up units, N pull-down units, and N signal output terminals. The $n^{th}$ pull-up unit is connected with a pull-up node, a high voltage source, an $n^{th}$ clock signal input terminal and an $n^{th}$ pull-down unit, the $n^{th}$ (Continued)

pull-down unit is connected to a pull-down node and a low voltage power source, and a connection point of the $n^{th}$ pull-up unit and the $n^{th}$ pull-down unit is further connected to the $n^{th}$ signal output terminal. The output control unit is configured to: provide clock signals from N clock signal input terminals to the N signal output terminals respectively under the control of a voltage of the pull-up node, and pull down levels of output signals of the N signal output terminals.

20 Claims, 10 Drawing Sheets

(52) U.S. Cl.
CPC ............... *G09G 2310/0205* (2013.01); *G09G 2310/0283* (2013.01); *G09G 2310/0286* (2013.01); *G09G 2310/08* (2013.01); *G09G 2330/023* (2013.01)

(56) References Cited

U.S. PATENT DOCUMENTS

| | | | | |
|---|---|---|---|---|
| 9,747,854 B2* | 8/2017 | Li | ................... | G09G 3/3655 |
| 2008/0055225 A1* | 3/2008 | Pak | ................... | G09G 3/3677 345/96 |
| 2011/0013740 A1* | 1/2011 | Lin | ................... | G11C 19/28 377/79 |
| 2011/0216876 A1* | 9/2011 | Amano | ............... | G11C 19/184 377/75 |
| 2011/0316833 A1* | 12/2011 | Chang | ................ | G09G 3/3677 345/211 |
| 2014/0119490 A1* | 5/2014 | Yang | ................... | G09G 3/3677 377/64 |
| 2014/0159997 A1* | 6/2014 | Chen | ................... | G09G 3/3611 345/87 |
| 2015/0016585 A1* | 1/2015 | Toyotaka | ............ | G11C 19/287 377/77 |
| 2015/0116194 A1* | 4/2015 | Matsui | ................ | G09G 3/3266 345/100 |
| 2015/0332784 A1* | 11/2015 | Yan | ..................... | G09G 3/3611 377/64 |
| 2016/0012764 A1* | 1/2016 | Xu | ....................... | G11C 19/28 345/204 |
| 2016/0049133 A1* | 2/2016 | Park | .................... | G09G 3/3648 345/212 |
| 2016/0141051 A1* | 5/2016 | Chen | ................... | G11C 19/28 377/75 |
| 2016/0189683 A1* | 6/2016 | Chen | ................... | G09G 3/3677 345/213 |
| 2016/0247442 A1* | 8/2016 | Dai | ..................... | G09G 3/3677 |
| 2016/0268004 A1* | 9/2016 | Li | ......................... | G11C 19/28 |
| 2016/0358666 A1* | 12/2016 | Pang | .................. | G11C 19/287 |
| 2016/0372063 A1* | 12/2016 | Li | ......................... | G11C 19/28 |
| 2017/0039971 A1* | 2/2017 | Huang | ................. | G09G 3/3677 |
| 2017/0178581 A1* | 6/2017 | Li | ....................... | G09G 3/3655 |
| 2017/0193957 A1* | 7/2017 | Liu | ..................... | G09G 3/3696 |
| 2017/0358267 A1* | 12/2017 | Feng | .................. | G09G 3/3677 |

FOREIGN PATENT DOCUMENTS

| | | | |
|---|---|---|---|
| CN | 103226927 A | | 7/2013 |
| CN | 103985363 | * | 8/2014 |
| CN | 103985363 A | | 8/2014 |
| CN | 104700803 A | | 6/2015 |
| CN | 104700805 A | | 6/2015 |
| CN | 104766575 A | | 7/2015 |
| CN | 105096865 A | | 11/2015 |
| KR | 1020050058674 A | | 6/2005 |

OTHER PUBLICATIONS

International Search Report and Written Opinion dated May 11, 2016; PCT/CN2016/097100.
The First Chinese Office Action dated Mar. 30, 2017; Appln. No. 201510477391.0.

* cited by examiner

US 10,217,428 B2

OUTPUT CONTROL UNIT FOR SHIFT REGISTER, SHIFT REGISTER AND DRIVING METHOD THEREOF, AND GATE DRIVING DEVICE

TECHNICAL FIELD

Embodiments of the present disclosure relate to an output control unit of a shift register, a shift register and a driving method thereof, and a gate driving device.

BACKGROUND

Thin film transistor liquid crystal displays (TFT-LCDs) are widely applied in various fields of production and life. While displaying, a TFT-LCD drives pixels in the display panel by a driver circuit for display. The driver circuit of a TFT-LCD mainly includes a gate driver circuit and a data driver circuit. The data driver circuit is configured to latch input data in sequence according to timing of a clock signal and convert the latched data into analog signals and input the analog signals into data lines of the display panel. The gate driver circuit is generally implemented by shift registers that convert the clock signals into an on/off voltage and outputs them to gate lines on the display panel respectively. A gate line on the display panel is generally connected with a shift register, namely a stage of the shift registers. Scanning of pixels in the display panel line by line is implemented by making the shift registers output the on voltage in turn. This line-by-line scanning of pixels may be classified into uni-directional scanning and bi-directional scanning according to the scanning direction. At present, in mobile products, in view of improvements on production capacity and yields of the mobile products, it generally needs to implement bi-direction scanning.

As the mobile products such as mobile telephones and tablet computers are getting lighter, thinner and more refined, implementation of a narrow rim as become a development trend. For a traditional gate driver circuit, one stage of the circuit can only drive one gate line. Development of a circuit with fewer TFTs has an important significance for achieving an ultra-thin rim.

In addition, a notable problem with products of mobile telephones is a large power consumption. If power of a battery of a mobile telephone is insufficient, a common measure at present is to make the mobile telephone enter a low power consumption mode. At present, there is no further measure except for conventional measures such as shutting down the network.

SUMMARY

The present disclosure provides an output control unit of a shift register, a shift register and a driving method thereof, and a gate driving device. They can drive multiple rows of gate lines, and at the same time guarantee there is no interference among outputs. They can reduce the number of transistors used and reduce the power consumption of the screen.

According to an aspect of the present disclosure, an output control unit of a shift register is disclosed, which includes:

N pull-up units, wherein an nth pull-up unit is connected with a pull-up node, a high voltage source, an nth clock signal input terminal and an nth pull-down unit;

N pull-down units, wherein an nth pull-down unit is connected with a pull-down node and a low voltage source; and N signal output terminals, wherein a connection point between the nth pull-up unit and the nth pull-down unit is also connected with an nth signal output terminal;

wherein the output control unit is configured to provide clock signals from N clock signal input terminals to the N signal output terminals respectively under a control of a voltage of the pull-up node, and pull down voltage levels of output signals of the N signal output terminals under a control of a signal provided by the pull-down node; and wherein n is an integer, and $2 \leq N \leq 4$, $1 \leq n \leq N$.

According to another aspect of the disclosure, a shift register is disclosed, which includes:

a scanning direction selecting unit connected with a first power input terminal, a second power input terminal, a signal input terminal and a reset signal terminal, and configured to provide an input signal of the signal input terminal to a pull-up node under a control of a voltage inputted at the first power input terminal, or to provide an input signal at the reset signal terminal to the pull-up node under a control of a voltage inputted at the second power input terminal, the pull-up node being an output node of the scanning direction selecting unit;

a reset control unit with an input terminal connected with the pull-up node, a reset clock signal input terminal and a low voltage source, the reset control unit being configured to pull down a voltage level of the pull-up node according to a signal at the reset clock signal input terminal and to provide a reset control signal at the pull-down node, the pull-down node being an output node of the reset control unit;

an output control unit connected with the pull-up node, the pull-down node, N clock signal input terminals, the low voltage source and a high voltage source, wherein n is an integer, and $2 \leq N \leq 4$;

wherein the output control unit is the output control unit described above.

According to yet another aspect of the disclosure, a gate driving device is disclosed, which comprises a plurality of shift registers connected in series, each of the shift registers is the shift register described above with N=2. Except for a last shift register, each remaining shift register has a second signal output terminal connected with a signal input terminal of its next adjacent shift register; and except for a first shift register, each remaining shift register has a first signal output terminal connected with a reset signal terminal of its previous adjacent shift register;

upon forward scanning, a frame start signal is inputted at a signal input terminal of the first shift register; and upon reverse scanning, the frame start signal is inputted at a reset signal terminal of the last shift register.

Accordingly to yet another aspect of the disclosure, a method for driving a shift register that includes a scanning direction selecting unit, a reset control unit and an output control unit is disclosed. The method comprises during a frame:

in a first phase, making a first signal output terminal and a second signal output terminal of the shift register each output a low level signal by the reset control unit and the output control unit;

in a second phase, making the first signal output terminal of the shift register output a high level signal and the second signal output terminal output the low level signal by the reset control unit and the output control unit;

in a third phase, making the first signal output terminal of the shift register output the low level signal and the second signal output terminal output the high level signal by the reset control unit and the output control unit;

in a fourth phase, making the first signal output terminal and the second signal output terminal of the shift register each output the low level signal by the reset control unit and the output control unit; and after the fourth phase, making the first signal output terminal and the second signal output terminal of the shift register continue to output the low level signal by the reset control unit and the output control unit until arrival of a next frame.

Accordingly to yet another aspect of the disclosure, a method for driving a shift register that includes a scanning direction selecting unit, a reset control unit and an output control unit is disclosed. The method comprises during a frame:

in a first phase and a second phase, making a first signal output terminal and a second signal output terminal of the shift register each output a low level signal by the reset control unit and the output control unit;

in a third phase and a fourth phase, making the first signal output terminal and the second signal output terminal of the shift register each output a high level signal by the reset control unit and the output control unit;

in a fifth phase, making the first signal output terminal and the second signal output terminal of the shift register each output the low level signal by the reset control unit and the output control unit; and after the fifth phase, making the first signal output terminal and the second signal output terminal of the shift register continue to output the low level signal by the reset control unit and the output control unit until arrival of a next frame.

DETAILED DESCRIPTION

Hereafter, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

Transistors adopted in embodiments of the present disclosure may all be thin film transistors or field effect transistors or other devices with the same characteristics. In these embodiments, the connection between a drain electrode and a source electrode of each transistor may be exchanged. Therefore, drain electrodes and source electrodes of transistors in embodiments of the present disclosure are practically not different from each other. Here, only to differentiate two electrodes other than a gate electrode of a transistor, one of them is referred to as a drain electrode, and the other is referred to as a source electrode.

Figure 1:
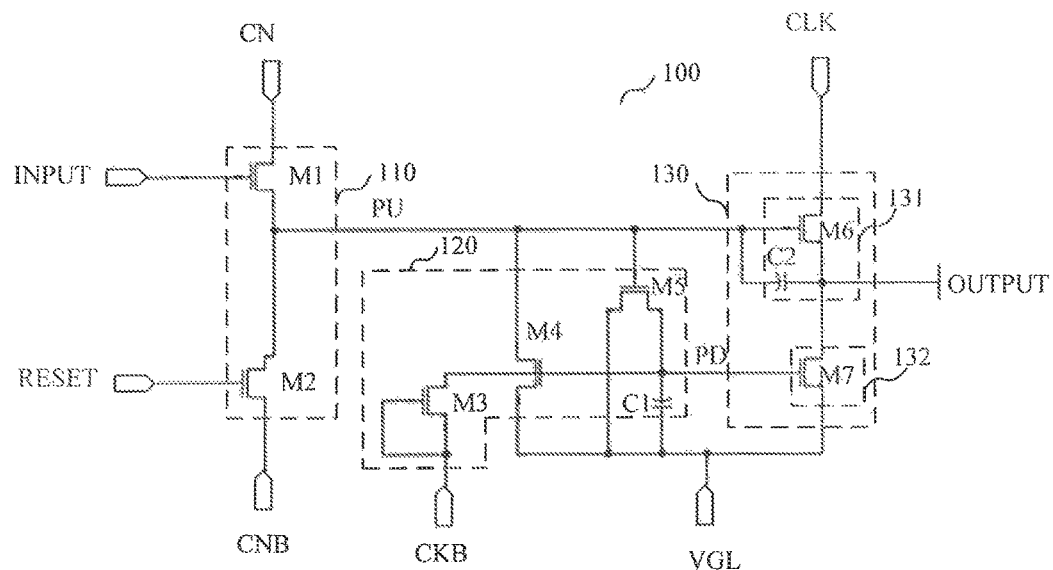
FIG. 1 shows a circuit diagram of a traditional shift register.

FIG. 1 shows a circuit diagram of a traditional shift register (using 7T2C as an example). As shown in FIG. 1, the shift register 100 includes a scanning direction selecting unit 110, a reset control unit 120 and an output control unit 130. The output control unit 130 includes a pull-up unit 131 and a pull-down unit 132.

The scanning direction selecting unit 110 includes a first transistor Ml and a second transistor M2. The scanning direction selecting unit 110 connects to a first power input terminal CN, a second power input terminal CNB, a signal input terminal INPUT and a reset signal terminal RESET.

The reset control unit 120 includes a third transistor M3, a fourth transistor M4, a fifth transistor M5 and a first capacitor C1. The reset control unit 120 is connected with a reset clock signal input terminal CKB and a low voltage source VGL, and also connected with an output terminal of the scanning direction selecting unit 110 at a pull-up node PU.

The pull-up unit 131 includes a sixth transistor M6 and a second capacitor C2. The pull-up unit 131 is connected with a clock signal input terminal CLK, the pull-up node PU and a signal output terminal OUTPUT.

The pull-down unit 132 includes a seventh transistor M7. The pull-down unit 132 is connected with the low voltage source VGL and also with the reset control unit 120 at a pull-down node PD. The pull-down unit 132 is also connected with the signal output terminal OUTPUT.

Description will be provided below by taking the above-mentioned transistors as N-type transistors as an example.

It is to be noted that the above-mentioned shift register 100 is capable of bi-directional scanning. While scanning forwardly and scanning reversely, the structure of the shift register does not change, and only functions of the signal input terminal INPUT and the reset signal terminal RESET change. For example, upon forward scanning, a high level signal VDD is input from the first power input terminal CN and a low level signal VSS is input from the second power input terminal CNB. Upon reverse scanning, the low level signal VSS is input from the first power input terminal CN and the high level signal VDD is input from the second power input terminal CNB. The signal input terminal INPUT of forward scanning serves as a reset signal terminal RESET of reverse scanning, and the reset signal terminal RESET of forward scanning serves as a signal input terminal INPUT of reverse scanning.

Figure 2:
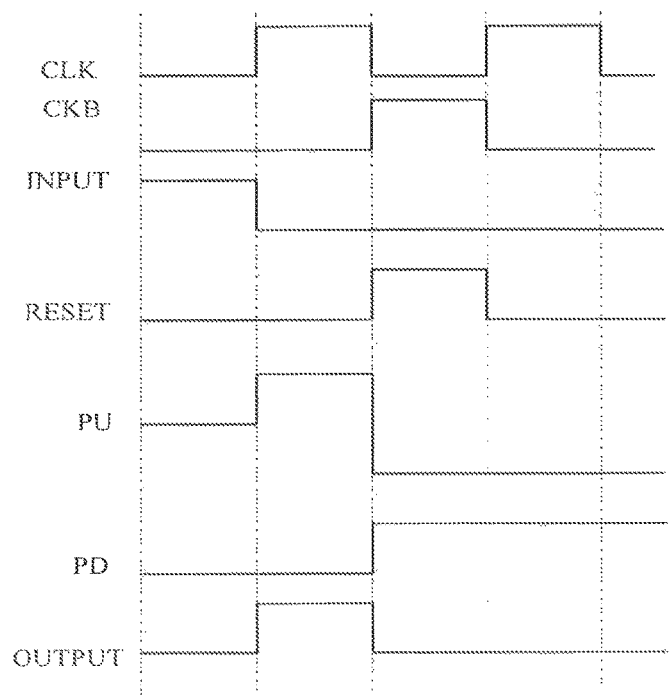
FIG. 2 shows a timing sequence diagram of signals while the shift register in FIG. 1 is scanning forwardly.

FIG. 2 shows a timing sequence diagram of signals when the shift register in FIG. 1 is scanning forwardly. As shown in FIG. 2, when a signal inputted from the signal input terminal INPUT is of a high level and a signal inputted from the reset signal terminal RESET is of a low level, the first transistor M1 is turned on, the second transistor M2 is not turned on, and a high level signal inputted from the first power input terminal CN may pull up a voltage level of the pull-up node PU. The pull-up node PU is of a high level and turns on the transistor M5, causing a voltage level of the pull-down node PD to be a low level. Next, a high-level signal is input from the clock signal input terminal CLK. Since the pull-up node PU is of the high voltage level, the sixth transistor M6 is turned on and the signal output terminal OUTPUT outputs a high level signal. At the same time, due to the bootstrap function of the second capacitor C2, the voltage level of the pull-up node PU is further pulled up. Next, when the signal input from the reset signal terminal RESET is of a high level and the signal input from the signal input terminal INPUT is of a low level, the first transistor MI is not turned on, the second transistor M2 is turned on, and the low level signal input from the second power input terminal CNB may pull down the voltage level of the pull-up node PU to be a low level. At the same time, the reset clock signal inputted from the reset clock signal input terminal CKB is of a high level, the third transistor M3 is turned on, and the voltage level of the pull-down node PD is pulled up, the fourth transistor M4 and the seventh transistor M7 are turned on, and the voltage level of the pull-up node PU is pulled down, and the signal output terminal OUTPUT outputs a low level signal.

This traditional shift register can drive only one gate line, and each stage of the gate driver circuit including this kind of shift registers can only drive one gate line. For example, for a resolution of FHD level, for a pixel circuit of 1920 rows*1080 columns, a total of 1920 stages of shift registers are needed to drive gate lines and the shift register in each stage needs to be configured with up to 7 transistors, which is not beneficial for achieving a narrow-rim design.

Figure 3:
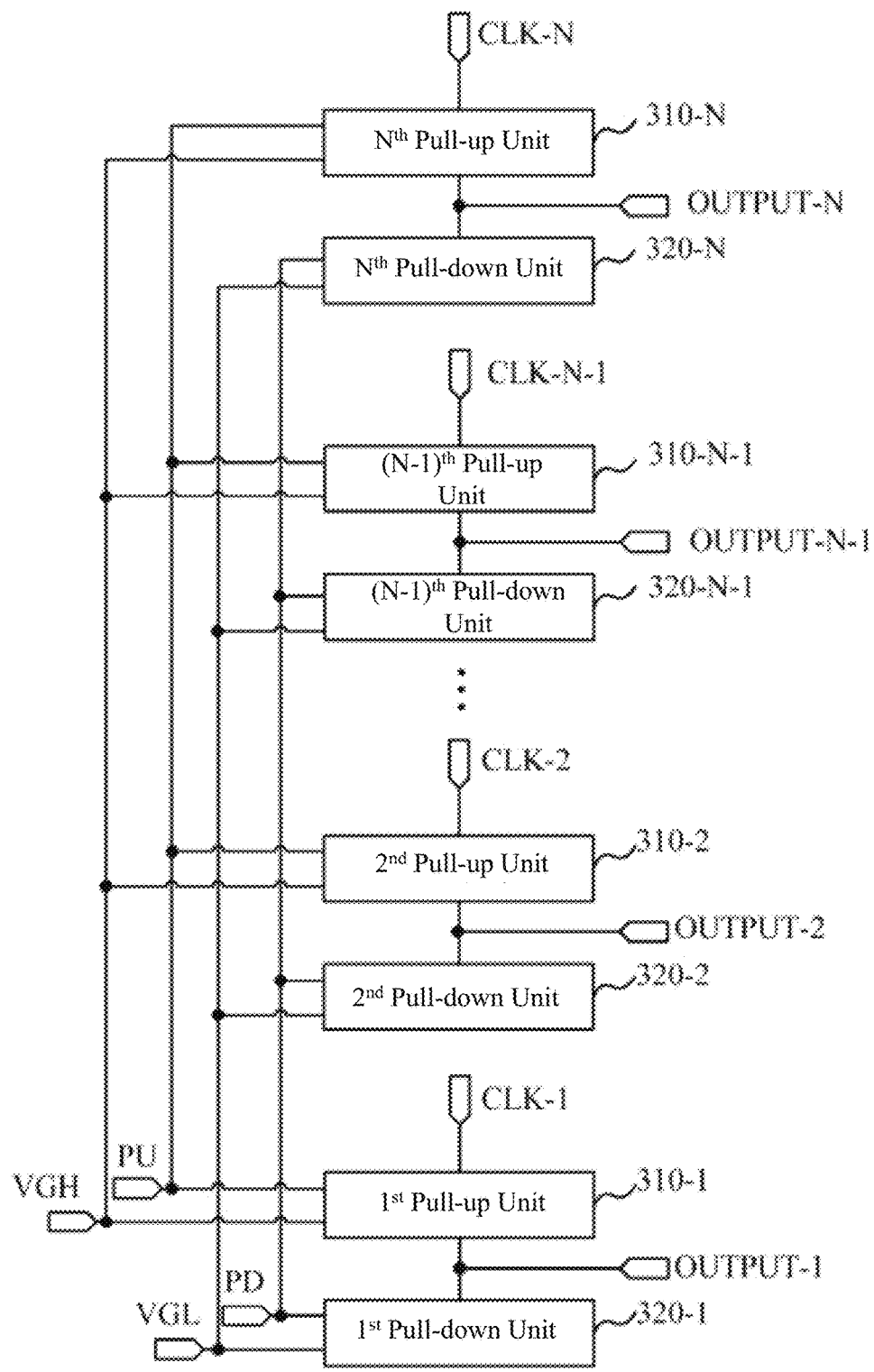
FIG. 3 shows a block diagram of an output control unit of a shift register according to an embodiment of the present disclosure.

FIG. 3 shows a block diagram of an output control unit 300 of a shift register according to an embodiment of the present disclosure. As shown in FIG. 3, the output control unit 300 includes N pull-up units, N pull-down units and N signal output terminals, where n is an integer and $2 \leq N \leq 4$. For $1 \leq n \leq N$, the $n^{th}$ pull-up unit 310-n is connected with the pull-up node PU, the high voltage source VGH, the $n^{th}$ clock signal input terminal CLK-n and the nth pull-down unit, and the $n^{th}$ pull-down unit 320-n is connected with the pull-down node PD and the low voltage source VGL. Furthermore, a connection point between the $n^{th}$ pull-up unit 310-n and the nth pull-down unit 320-n is further connected with the $n^{th}$ signal output terminal OUTPUT-n. For example, the first pull-up unit 310-1 is connected with the pull-up node PU, the high voltage source VGH and the first clock signal input terminal CLK-1; the first pull-down unit 320-1 is connected with the pull-down node PD and the low voltage source VGL; and a connection point between the first pull-up unit 310-1 and the first pull-down unit 320-1 is connected to the first signal output terminal OUTPUT-1. The output control unit 300 is configured to supply clock signals from N clock signal input terminals CLK-n to N signal output terminals OUTPUT-n respectively under the control of the voltage of the pull-up node PU, and pull down the levels of the output signals of the N signal output terminals OUTPUT-n to a low level under the control of a signal provided by the pull-down node PD.

As it can be seen from FIG. 3, the output control unit 300 has multiple (N) signal output terminals and therefore can drive multiple rows (N rows) of gate lines.

Figure 4:
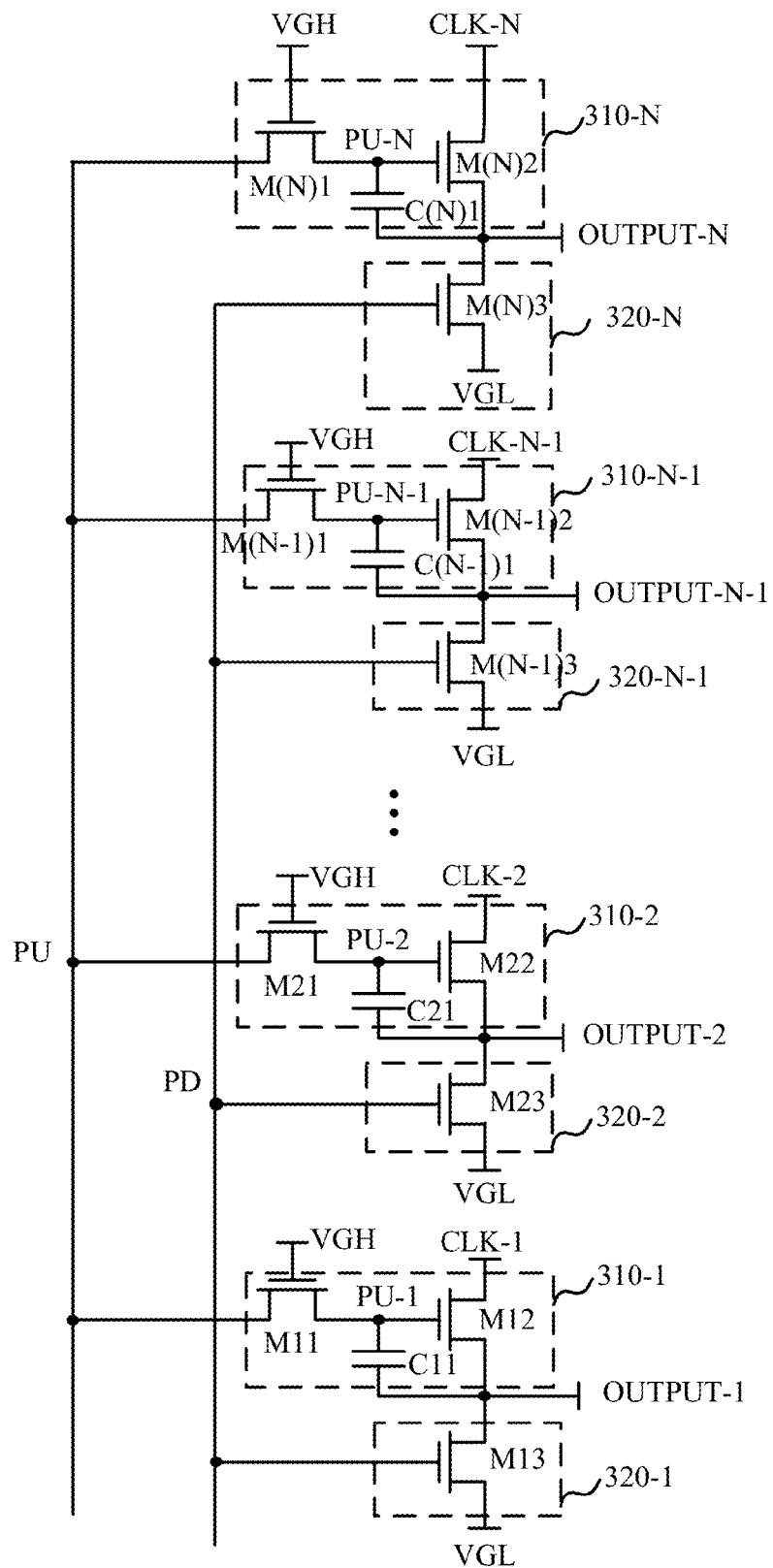
FIG. 4 shows a circuit structure diagram of the output control unit of FIG. 3 according to an embodiment of the present disclosure.

FIG. 4 shows a circuit structure diagram of the output control unit 300 of FIG. 3 according to an embodiment of the present disclosure. As shown in FIG. 4, each pull-up unit of the output control unit 300 includes two transistors and one capacitor, namely a pull-up control transistor, a pull-up transistor and a storage capacitor. Each pull-down unit includes a transistor, namely a pull-down transistor. For example, for $1 \leq n \leq N$, where N is an integer, and $2 \leq N \leq 4$, the $n^{th}$ pull-up unit 310-n includes a pull-up control transistor Mn1, a pull-up transistor Mn2 and a storage capacitor Cn1, and the $n^{th}$ pull-down unit 320-n includes a pull-down transistor Mn3. For example, the first pull-up unit 310-1 includes a pull-up control transistor M11, a pull-up transistor M12 and a storage capacitor C11, and the first pull-down unit 320-1 includes a pull-down transistor M13. The second pull-up unit 310-2 includes a pull-up control transistor M21, a pull-up transistor M22 and a storage capacitor C21, and the second pull-down unit 320-2 includes a pull-down transistor M23.

A source electrode of the pull-up control transistor Mn1 of the nth pull-up unit 310-n is connected with the pull-up node PU, a gate electrode of the pull-up control transistor Mn1 is connected with the high voltage source VGH, and a drain of the pull-up control transistor Mn1 is connected with an $n^{th}$ node PU-n.

A source electrode of the pull-up transistor Mn2 of the $n^{th}$ pull-up unit is connected with the $n^{th}$ clock signal input terminal CLK-n, the gate electrode of the pull-up transistor Mn2 is connected with the nth node PU-n, and the drain electrode of the pull-up transistor Mn2 is connected with the nth signal output terminal OUTPUT-n.

An end of the storage capacitor Cn1 of the $n^{th}$ pull-up unit is connected with the nth node PU-n, and the other end is connected with the $n^{th}$ signal output terminal OUTPUT-n.

A source electrode of the pull-down transistor Mn3 of the $n^{th}$ pull-down unit is connected with the nth signal output terminal OUTPUT-n, the gate electrode of the pull-down transistor Mn3 is connected with the pull-down node PD, and the drain electrode of the pull-down transistor Mn3 is connected with the low voltage source VGL.

For example, for n=2, the source electrode of the pull-up control transistor M21 of the second pull-up unit 310-2 is connected with the pull-up node PU, the gate electrode of the pull-up control transistor M21 is connected with the high voltage source VGH, and the drain electrode of the pull-up control transistor M21 is connected with the second node PU-2; the source electrode of the pull-up transistor M22 is connected with the second clock signal input terminal CLK-2, the gate electrode of the pull-up transistor M22 is connected with the second node PU-2, the drain electrode of the pull-up transistor M22 is connected with the second signal output terminal OUTPUT-2; an end of the storage capacitor C21 is connected with the second node PU-2, and the other end of the storage capacitor C21 is connected with the second signal output terminal OUTPUT-2; the source electrode of the pull-down transistor M23 of the second pull-down unit 320-2 is connected with the second signal output terminal OUTPUT-2, the gate electrode of the pull-down transistor M23 is connected with the pull-down node PD, and the drain electrode of the pull-down transistor M23 is connected with the low voltage source VGL. As it can be seen from FIG. 4, the output control unit 300 has multiple (N) signal output terminals and therefore can drive multiple rows (N rows) of gate lines. The shift register utilizing the output control unit 300 according to an embodiment of the present disclosure may output multiple (N) driving signals and therefore can drive multiple (N) rows of gate lines and guarantee that there is no interference among outputs at the same time.

It is to be appreciated that illustrative circuit structures of pull-up units and pull-down units shown in FIG. 4 are only examples, and the units can adopt other appropriate circuit structures as long as they can implement their respective functions, which is not limited in the present disclosure.

Figure 5:
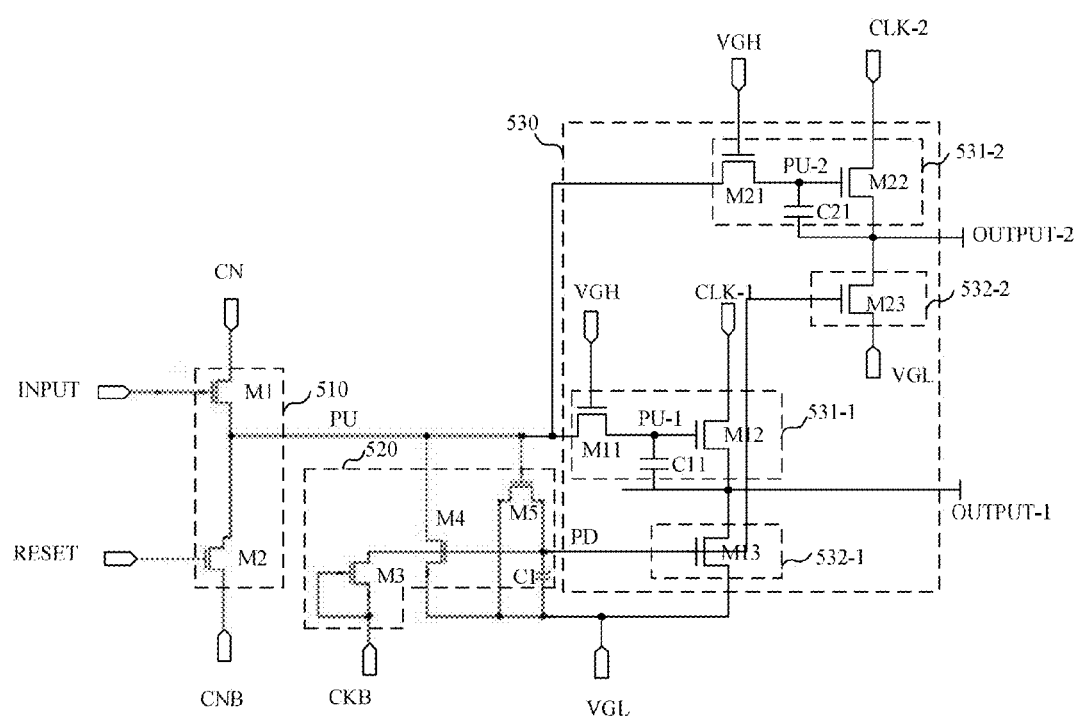
FIG. 5 is a circuit diagram after applying the output control unit of FIG. 4 to the shift register in FIG. 1.

FIG. 5 is a circuit diagram after application of the output control unit 300 of FIG. 4 to the shift register 100 in FIG. 1.

As it can be seen in FIG. 5, the shift register 500 in FIG. 5 can be obtained by replacing the output control unit 130 in FIG. 1 with the output control unit 300 in FIG. 4, namely replacing the pull-up unit 131 in FIG. 1 with the first to N$^{th}$ pull-up units (310-1 to 310-N) in FIG. 4 and replacing the pull-down unit 132 in FIG. 1 with the first to N$^{th}$ pull-down unit (320-1 to 320-N) in FIG. 4.

Referring to FIG. 5, the shift register 500 includes a scanning direction selecting unit 510, a reset control unit 520 and an output control unit 530. The output control unit 530 includes N pull-up units and N pull-down units. For simplicity of description, N=2 is described as an example in FIG. 5. However, it is appreciated that the present disclosure is not limited to applying an output control unit 300 with N=2 to the shift register 100 in FIG. 1, and N may be any integer that is greater than or equal to 2 and less than or equal to 4. For the present embodiment, N=2, that is, the output control unit 530 includes a first pull-up unit 531-1, a second pull-up unit 531-2, a first pull-down unit 532-1 and a second pull-down unit 532-2.

The scanning direction selecting unit 510 is connected with the first power input terminal CN, the second power input terminal CNB, the signal input terminal INPUT and the reset signal terminal RESET, and is configured to provide the input signal of the signal input terminal INPUT to the pull-up node PU under the control of the voltage input at the first power input terminal, or to provide the input signal of the reset signal terminal RESET to the pull-up node PU under the control of the voltage input at the second power input terminal. The pull-up node PU is an output node of the scanning direction selecting unit 510.

Input terminals of the reset control unit 520 are connected with the pull-up node PU, the reset clock signal input terminal CKB and the low voltage source VGL respectively, and the reset control unit 520 is configured to pull down the voltage level of the pull-up node PU according to the signal of the reset clock signal input terminal CKB and provide a reset control signal at the pull-down node PD. The pull-down node PD is an output node of the reset control unit 520.

The output control unit 530 is connected with the pull-up node PU, the pull-down node PD, the N clock signal input terminals CLK-n (where 1≤n≤N, N is an integer, and 2≤N≤4), the low voltage source VGL and the high voltage source VGH. The output control unit 530 is configured to provide clock signals from the N clock signal input terminals CLK-n to the N signal output terminals OUTPUT-n respectively under the control of the voltage of the pull-up node PU, and to pull down the voltage levels of the output signals at the N signal output terminals OUTPUT-n under the control of the reset control signal provided by the pull-down node PD.

The scanning direction selecting unit 510 includes a first transistor M1 and a second transistor M2. The source electrode of the first transistor M1 is connected to the first power input terminal CN, the gate electrode of the first transistor M1 is connected to the signal input terminal INPUT and the drain electrode of the first transistor M1 is connected to the pull-up node PU. The source electrode of the second transistor M2 is connected to the second power input terminal CNB, the gate electrode of the second transistor M2 is connected to the reset signal terminal RESET and the drain electrode of the second transistor M2 is connected to the pull-up node PU.

The reset control unit 520 includes a third transistor M3, a fourth transistor M4, a fifth transistor M5 and a first capacitor C1. The source electrode and the gate electrode of the third transistor M3 are connected with the reset clock signal input terminal CKB, and the drain electrode of the third transistor M3 is connected with the pull-down node PD. The source electrode of the fourth transistor M4 is connected with the low voltage source VGL, the gate electrode of the fourth transistor M4 is connected with the pull-down node PD, and the drain electrode of the fourth transistor M4 is connected with the pull-up node PU. The source electrode of the fifth transistor M5 is connected with the low voltage source VGL, the gate electrode of the fifth transistor M5 is connected with the pull-up node PU, and the drain electrode of the fifth transistor M5 is connected with the pull-down node PD. One end of the first capacitor C1 is connected with the pull-down node PD, and the other end is connected with the low voltage source VGL.

The first pull-up unit 531-1 of the output control unit 530 includes a pull-up control transistor M11, a pull-up transistor M12 and a storage capacitor C11, and the first pull-down unit 532-1 includes a pull-down transistor M13. The second pull-up unit 531-2 includes a pull-up control transistor M21, a pull-up transistor M22 and a storage capacitor C21, and the second pull-down unit 532-2 includes a pull-down transistor M23.

The source electrode of the pull-up control transistor M11 of the first pull-up unit 531-1 is connected with the pull-up node PU, the gate electrode of the pull-up control transistor M11 is connected with the high voltage source VGH, and the drain electrode of the pull-up control transistor M1 is connected with the first node PU-1.

The source electrode of the pull-up transistor M12 of the first pull-up unit 531-1 is connected with the first clock signal input terminal CLK-1, the gate electrode of the pull-up transistor M12 is connected with the first node PU-1, and the drain electrode of the pull-up transistor M12 is connected with the first signal output terminal OUTPUT-1.

An end of the storage capacitor C11 of the first pull-up unit 531-1 is connected with the first node PU-1, and the other end of the storage capacitor C11 is connected with the first signal output terminal OUTPUT-1.

The source electrode of the pull-down transistor M13 of the first pull-down unit 532-1 is connected with the first signal output terminal OUTPUT-1, the gate electrode of the pull-down transistor M13 is connected with the pull-down node PD, and the drain electrode of the pull-down transistor M13 is connected with the low voltage source VGL.

The source electrode of the pull-up control transistor M21 of the second pull-up unit 531-2 is connected with the pull-up node PU, the gate electrode of the pull-up control transistor M21 is connected with the high voltage source VGH, and the drain electrode of the pull-up control transistor M21 is connected with the second node PU-2.

The source electrode of the pull-up transistor M22 of the second pull-up unit 531-2 is connected with the second clock signal input terminal CLK-2, the gate electrode of the pull-up transistor M22 is connected with the second node PU-2, and the drain electrode of the pull-up transistor M22 is connected with the second signal output terminal OUTPUT-2.

An end of the storage capacitor C21 of the second pull-up unit 531-2 is connected with the second node PU-2, and the other end of the storage capacitor C21 is connected with the second signal output terminal OUTPUT-2.

The source electrode of the pull-down transistor M23 of the second pull-down unit 532-2 is connected with the second signal output terminal OUTPUT-2, the gate electrode of the pull-down transistor M23 is connected with the pull-down node PD, and the drain electrode of the pull-down transistor M23 is connected with the low voltage source VGL.

The shift register according to embodiments of the present disclosure may output multiple (N) driving signals and therefore can drive multiple (N) rows of gate lines and guarantee that there is no interference among outputs.

For example, for an FHD resolution level, for 1920 rows*1080 columns, with a shift register according to the present disclosure, it is possible to enable a shift register at one stage to drive at least two rows of gate lines. Thus, at most 960 stages of shift registers are needed to drive a screen of the FHD resolution. However, the shift register according to the present disclosure is not limited to driving two rows of gate lines, and it may drive 3 rows or even 4 rows of gate lines. Thus, the number of stages of shift registers needed may be reduced to 640 or 480.

In this way, after using this circuit structure, it is possible to significantly reduce the number of transistors of the shift registers, thereby implementing a gate line driving function with a smaller area, realizing narrower rim, and then resulting in a better improvement effect for the electrostatic prevention characteristic of the screen.

It is understood that illustrative circuit structures of the scanning direction selecting unit 510, the reset control unit 520 and the output control unit 530 shown in FIG. 5 are only by way of examples. The units may also adopt other appropriate circuit structures as long as they can implement their respective functions, which is not limited in the present disclosure.

Figure 6:
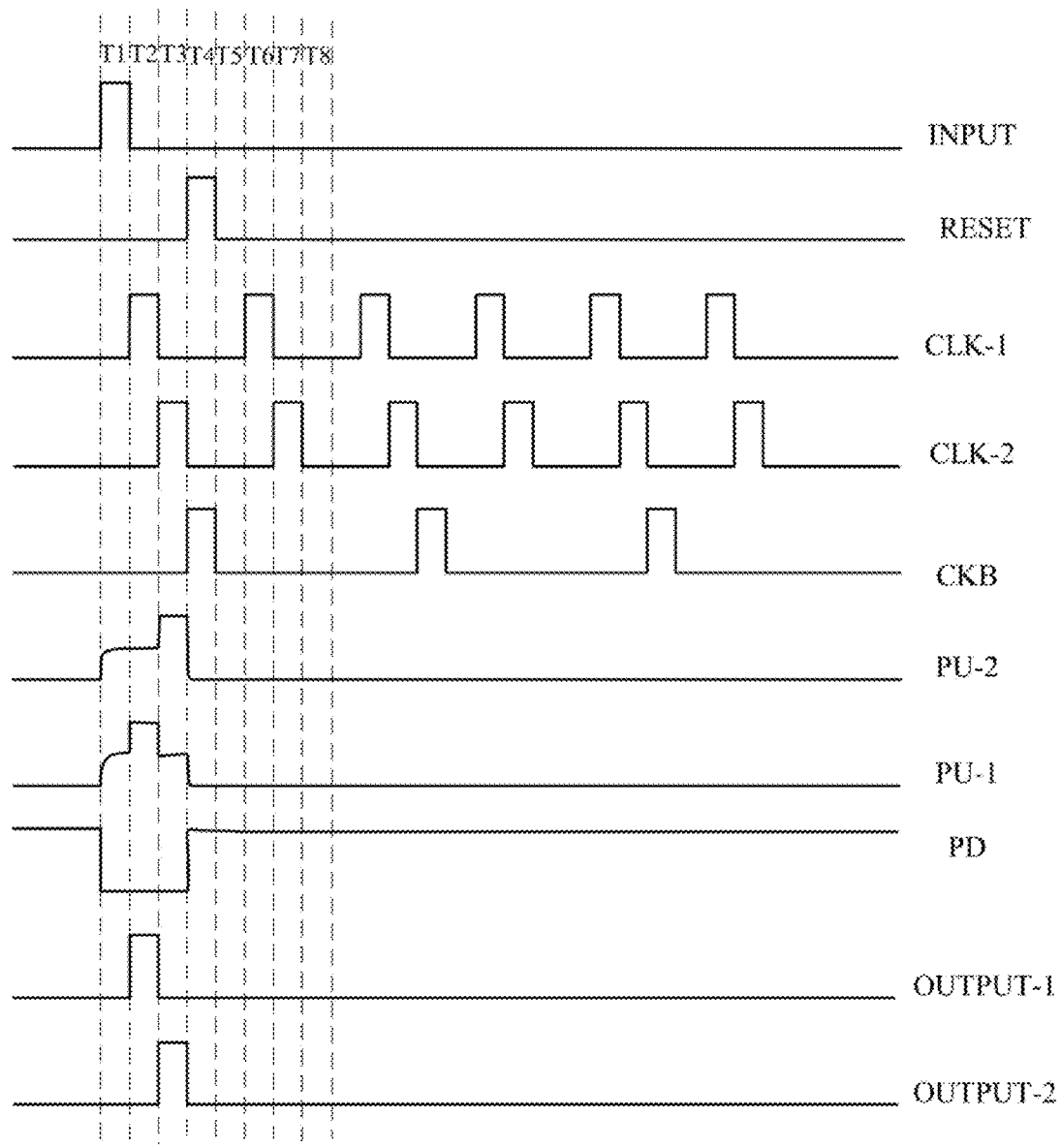
FIG. 6 shows a timing sequence diagram of signals while the shift register in FIG. 5 is scanning forwardly.

FIG. 6 shows a timing sequence diagram of signals while the shift register 500 in FIG. 5 is scanning forwardly. A specific operation process of the above-mentioned shift register 500 according to embodiments of the present disclosure will be described below with reference to FIG. 5. The above-mentioned transistors all being N type transistors will be described below as an example.

It is to be noted that the above-mentioned shift register 500 is capable of bi-directional scanning. While scanning forwardly and scanning reversely, the structure of the shift register 500 does not change, and only functions of the signal input terminal INPUT and the reset signal terminal RESET change. For example, upon forward scanning, a high level signal VDD is input from the first power input terminal CN and a low level signal VSS is input from the second power input terminal CNB. Upon reverse scanning, a low level signal VSS is input from the first power input terminal CN and a high level signal VDD is input from the second power input terminal CNB. The signal input terminal INPUT of forward scanning serves as the reset signal terminal RESET of reverse scanning, and the reset signal terminal RESET of forward scanning serves as the signal input terminal INPUT of reverse scanning.

As shown in FIG. 6, during one frame, the operation process includes the following phases. The operation process will be described below with reference to FIGS. 5 and 6.

A first phase T1. By the reset control unit 520 and the output control unit 530, the first signal output terminal OUTPUT-1 and the second signal output terminal OUTPUT-2 of the shift register 500 both output a low level signal. A start signal STV input from the signal input terminal INPUT is a high level signal, and low level signals are input to all of the reset signal terminal RESET, the reset clock signal input terminal CKB, the first clock signal input terminal CLK-1 and the second clock signal input terminal CLK-2. The first transistor M1 is turned on, the second transistor M2 is not turned on, a high level signal input from the first power input terminal CN pulls up a voltage level of the pull-up node PU. The third transistor M3 is not turned on, which does not affect the voltage level of the pull-down node PD. The pull-up node PU is of the high level, causing the transistor M5 to be turned on and then the voltage level of the pull-down node PD to be pulled down. The high voltage source VGH turns on both the pull-up control transistor M11 of the first pull-up unit 531-1 and the pull-up-control transistor M21 of the second pull-up unit 531-2, and therefore the voltage levels of the first node PU-1 and the second node PU-2 are pulled up. The pull-up transistor M12 of the first pull-up unit 531-1 and the pull-up transistor M22 of the second pull-up unit 531-2 are both turned on to provide the low level signals inputted at the first clock signal input terminal CLK-1 and the second clock signal input terminal CLK-2 to the first signal output terminal OUTPUT-1 and the second signal output terminal OUTPUT-2, respectively.

A second phase T2. By the reset control unit 520 and the output control unit 530, the first signal output terminal OUTPUT-1 of the shift register 500 outputs a high level signal and the second signal output terminal OUTPUT-2 outputs a low level signal. A high level signal is input from the first clock signal input terminal CLK-1, and low level signals are input to all of the signal input terminal INPUT, the reset signal terminal RESET, the reset clock signal input terminal CKB, and the second clock signal input terminal CLK-2. The voltage level of the first node PU-1 is a high voltage level, and the pull-up transistor M12 of the first pull-up unit 531-1 is turned on, which provides the high level signal input at the first clock signal input terminal CLK-1 to the first signal output terminal OUTPUT-1. Due to the bootstrap function of the storage capacitor C11 of the first pull-up unit 531-1, the voltage level of the first node PU-1 is further pulled up.

A third phase T3: By the reset control unit 520 and the output control unit 530, the first signal output terminal OUTPUT-1 of the shift register 500 outputs a low level signal and the second signal output terminal OUTPUT-2 outputs a high level signal. A high level signal is input from the second clock signal input terminal CLK-2, and low level signals are input to all of the signal input terminal INPUT, the reset signal terminal RESET, the reset clock signal input terminal CKB, and the first clock signal input terminal CLK-1. The voltage level of the second node PU-2 is a high voltage level, and the pull-up transistor M22 of the second pull-up unit 531-2 is turned on, which provides the high level signal inputted at the second clock signal input terminal CLK-2 to the second signal output terminal OUTPUT-2. The voltage level of the first node PU-1 is the high voltage level, and the pull-up transistor M12 of the first pull-up unit 531-1 is turned on, which provides the low level signal inputted at the first clock signal input terminal CLK-1 to the first signal output terminal OUTPUT-1. Due to the bootstrap function of the storage capacitor C11 of the first pull-up unit 531-1, the voltage level of the first node PU-1 is pulled down preliminarily but still at a high level.

A fourth phase T4. By the reset control unit 520 and the output control unit 530, the first signal output terminal OUTPUT-1 and the second signal output terminal OUTPUT-2 of the shift register 500 both output low level signals. High level signals are input from the reset signal terminal RESET and the reset clock signal input terminal CKB, and low level signals are input to all of the signal input terminal INPUT, the first clock signal input terminal CLK-1 and the second clock signal input terminal CLK-2. The second transistor M2 is turned on, and the low level signal input from the second power input terminal CNB pulls down the voltage level of the pull-up node PU. Both the pull-up control transistor M11 of the first pull-up unit 531-1 and the pull-up control transistor M21 of the second pull-up unit 531-2 are turned on, thereby pulling down the voltage levels of the first node PU-1 and the second node PU-2. The third transistor M3 is turned on, causing the voltage level of the pull-down node PD to be pulled up. The pull-down transistor M13 of the first pull-down unit 532-1 and the pull-down transistor M23 of the second pull-down unit 532-2 are both turned on such that the first signal output terminal OUTPUT-1 and the second signal output terminal OUTPUT-2 output low level signals.

After the fourth phase T4, by the reset control unit 520 and the output control unit 530, the first signal output terminal OUTPUT-1 and the second signal output terminal OUTPUT-2 of the shift register 500 continue to output low level signals until arrival of a next frame. The first clock signal input terminal CLK-1 inputs a high level signal at a next phase after every three phases, the second clock signal input terminal CLK-2 inputs a high level signal in a next phase after every three phases, the reset clock signal input terminal CKB inputs a high level signal in a next phase after every seven phases, and other input signals and output signals remain constant until the next frame. The shift register 500 repeats the above-mentioned phases after receiving the high level signal input from the signal input terminal INPUT.

As it can be seen from FIG. 6, the signal inputted at the first clock signal input terminal CLK-1 has a duty cycle of 1:4, and after the signal inputted at the signal input terminal INPUT changes from an effective voltage to an ineffective voltage level, the signal inputted at the first clock signal input terminal CLK-1 begins to become an effective voltage level. The signal inputted at the second clock signal input terminal CLK-2 has a duty cycle of 1:4 and the signal input at the second clock signal input terminal CLK-2 is delayed by a pulse width comparing to the signal input at the first clock signal input terminal CLK-1. The signal input at the reset clock signal input terminal CKB has a duty cycle of 1:8, and the signal input at the reset clock signal input terminal CKB is delayed by a pulse width comparing to the signal input at the second clock signal input terminal CLK-2.

The above-mentioned pulse width may be set as needed.

A specific operation process of the shift register 500 upon reverse scanning according to embodiments of the present disclosure is similar to that upon forward scanning, and similar description will not be repeated herein.

Figure 7:
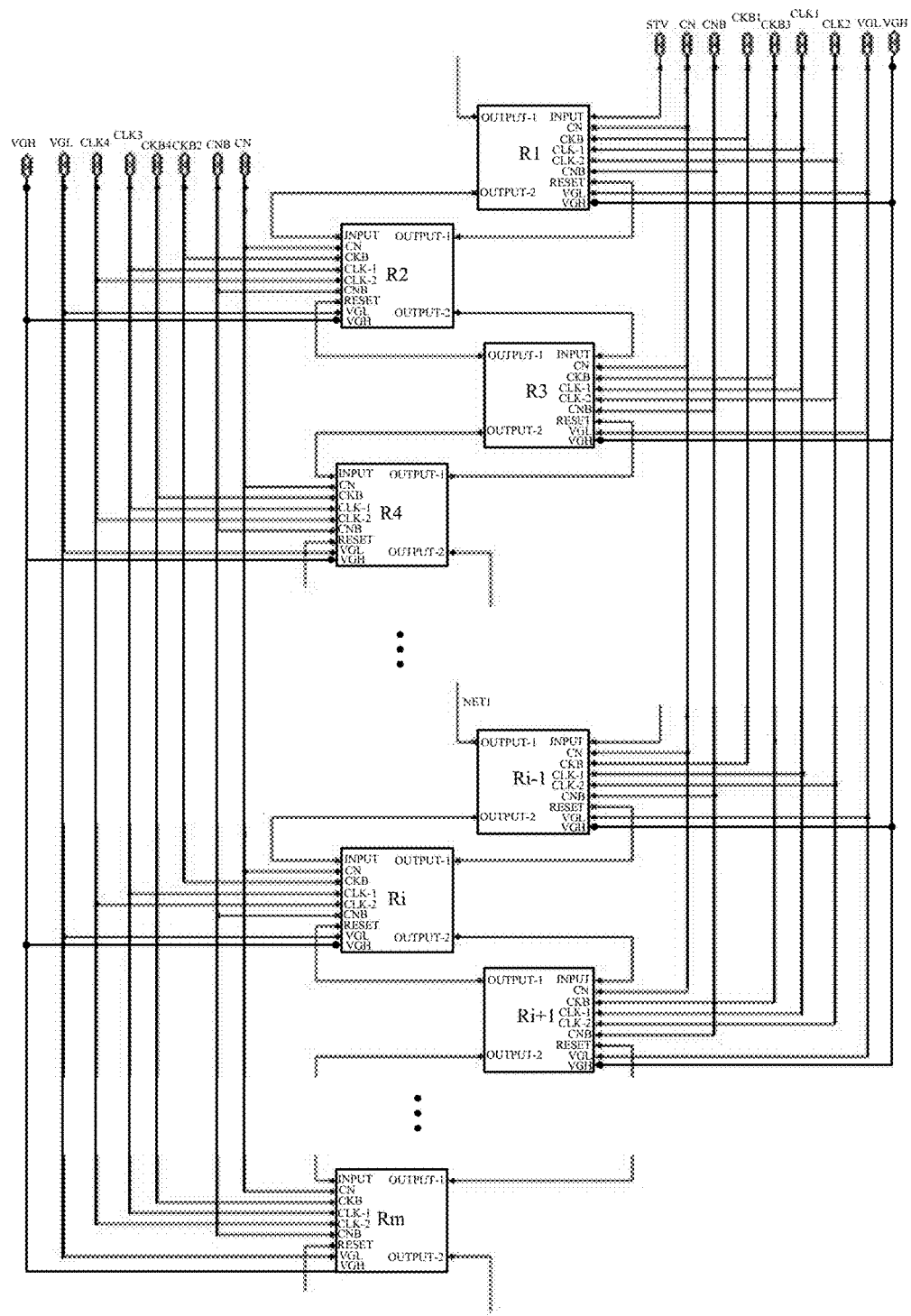
FIG. 7 shows a schematic diagram of a gate driving device formed by cascading a plurality of shift registers according to an embodiment of the present disclosure.

FIG. 7 shows a schematic diagram of a gate driving device formed by cascading a plurality of the above-mentioned shift registers 500 according to an embodiment of the present disclosure.

As shown in FIG. 7, in the gate driving device, the plurality of above-mentioned shift registers 500 are connected in series. Except for the last shift register Rm, each of the remaining shift registers Ri (1≤i<m) has its second signal output terminal OUTPUT-2 to be connected with the signal input terminal INPUT of its next adjacent shift register $R_{i+1}$; and except for the first shift register R1, each of the remaining shift register Ri (1<i≤m) has its first signal output terminal OUTPUT-1 to be connected with the reset signal terminal RESET of its previous adjacent shift register $R_{i-1}$. Upon forward scanning, a frame start signal STV is input to the signal input terminal INPUT of the first shift register R1; and upon reverse scanning, the frame start signal STV is input to the reset signal terminal RESET of the last shift register Rm.

As shown in FIG. 7, in the gate driving device, every two shift registers are of a group that is input with a group of clock signals CLK1 to CLK4. That is, every two shift registers form a group in which a first clock signal CLK1 is input to the first clock signal input terminal of the first shift register, and a second clock signal CLK2 is input to the second clock signal input terminal of the first shift register, a third clock signal CLK3 is input to the first clock signal input terminal of the second shift register and a fourth clock signal CLK4 is input to the second clock signal input terminal of the second shift register. For example, a clock signal CLK1 is input at the first clock signal input terminal CLK-1 of the first shift register R1, a clock signal CLK2 is input at the second clock signal input terminal CLK-2 of the first shift register R1, a clock signal CLK3 is input at the first clock signal input terminal CLK-1 of the second shift register R2, and a clock signal CLK4 is input at the second clock signal input terminal CLK-2 of the second shift register R2.

As shown in FIG. 7, in the gate driving device, every four shift registers are of a group and a group of reset clock signals CKB1 to CKB4 are input from the reset clock signal input terminals CKB of the shift registers. For example, a reset clock signal CKB1 is input at the reset clock signal input terminal CKB of the first shift register R1, a reset clock signal CKB2 is input at the reset clock signal input terminal CKB of the second shift register R2, a reset clock signal CKB3 is input at the reset clock signal input terminal CKB of the third shift register R3, and a reset clock signal CKB4 is input at the reset clock signal input terminal CKB of the fourth shift register R4.

Figure 8:
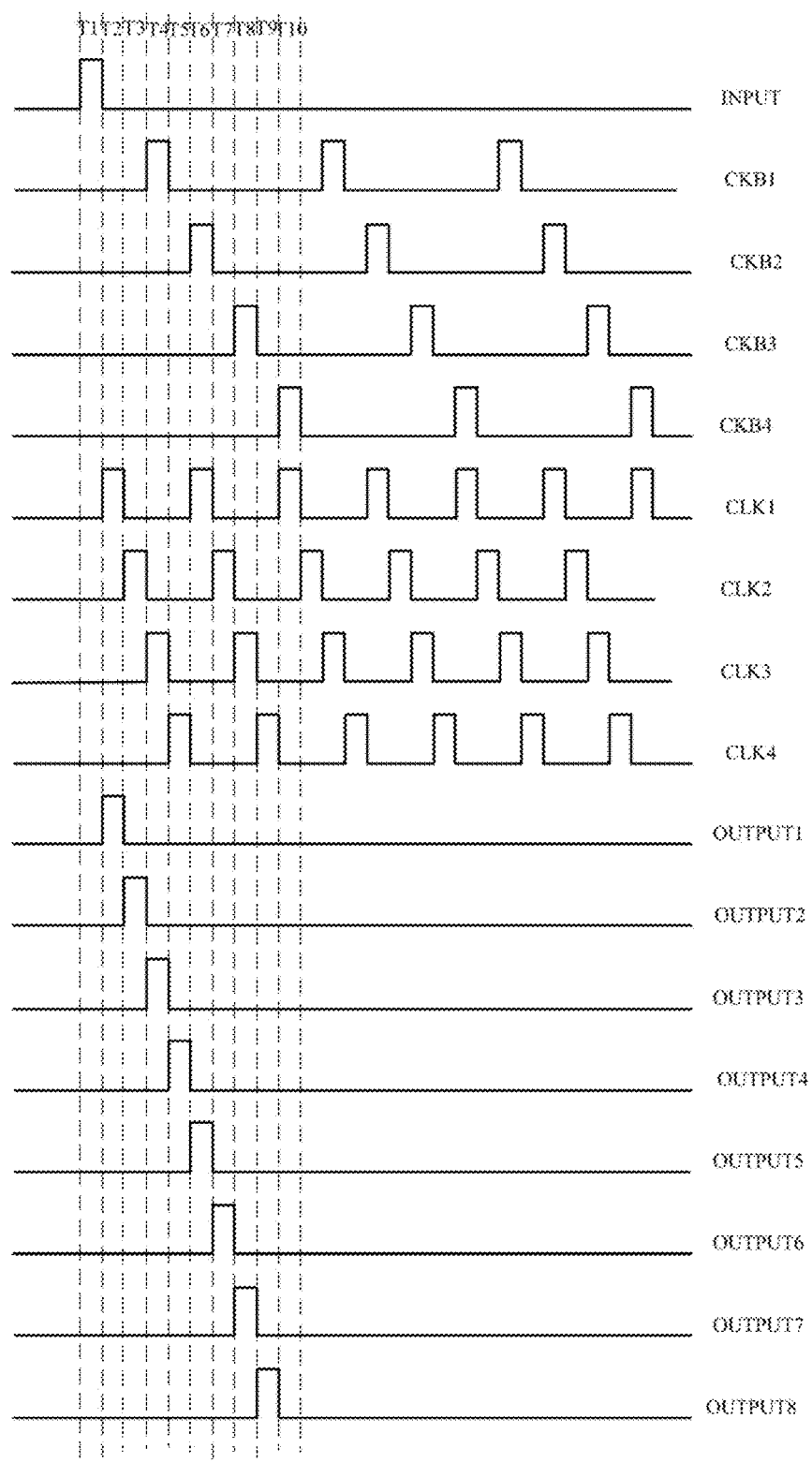
FIG. 8 shows a timing sequence diagram of signals while the gate driving device of FIG. 7 is scanning forwardly.

FIG. 8 shows a timing sequence diagram of signals when the gate driving device of FIG. 7 is scanning forwardly. For simplicity of description, the gate driving device including 4 shift registers will be described as an example in FIG. 8. As shown in FIG. 8, under the control of clock signals and reset clock signals, the first signal output terminals and the second signal output terminals of the shift registers R1 to R4 output signals OUTPUT1 to OUTPUT8 successively.

As it can be seen from FIG. 8, the clock signals CLK1 to CLK4 have a duty cycle of 1:4. After the signal input at the signal input terminal INPUT changes from an effective voltage level to an ineffective voltage level, the clock signal CLK1 begins to become an effective level. Clock signals CLK1 to CLK4 are delayed by one pulse width successively, namely, the clock signal CLK2 is delayed by a pulse width when compared with the clock signal CLK1, the clock signal CLK3 is delayed by a pulse width when compared with the clock signal CLK2, and the clock signal CLK4 is delayed by a pulse width when compared with the clock signal CLK3.

As it can be seen from FIG. 8, the reset clock signals CKB1 to CKB4 have a duty cycle of 1:8. The reset clock signals CKB1 to CKB4 are each delayed by a pulse width when compared to the clock signals inputted at the second clock signal input terminals CLK-2 of the shift registers at the same stages, respectively. For example, the reset clock signal CKB1 input at the reset clock signal input terminal CKB of the first shift register R1 is delayed by a pulse width when compared to the clock signal CLK2 input at the second clock signal input terminal CLK-2 of the first shift register R1, and the reset clock signal CKB2 input at the reset clock signal input terminal CKB of the second shift register R2 is delayed by a pulse width when compared to the clock signal CLK4 input at the second clock signal input terminal CLK-2 of the second shift register R2.

The above-mentioned pulse width may be set as needed.

A specific operation process of the shift registers R1 to R4 of the gate driving device according to embodiments of the present disclosure upon forward scanning is similar to that described above with reference to FIGS. 5 and 6, and similar description will not be repeated here.

A specific operation process of the gate driving device according to the embodiments of the present disclosure upon reverse scanning is similar to that upon forward scanning and will not be described any more herein.

Furthermore, by adjusting the timing sequence of signals of the shift register according to the present disclosure, it is possible to have a plurality of outputs to drive a plurality of gate lines at the same time. For example, for the UHD level of resolution, for a pixel circuit of 3840 rows×2160 columns, 3840 rows of gate lines need to be turned on row by row upon normal operation. However, an obvious problem with the UHD resolution for products of a mobile telephone level is the large power consumption. If the power of a battery of a mobile telephone is insufficient, a common measure at present is to make the mobile telephone enter a low power consumption mode. At present, there is no further measure except for conventional measures such as shutting down the network.

Figure 9:
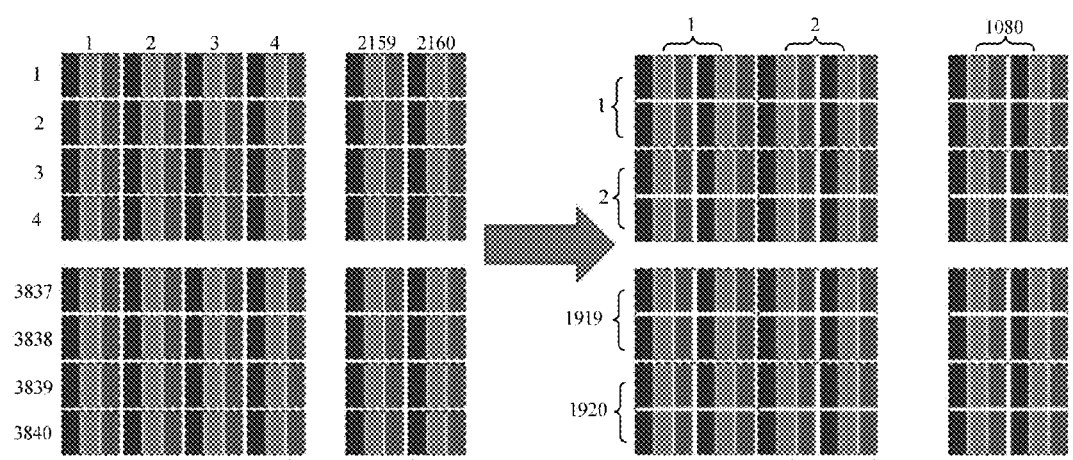
FIG. 9 shows schematically a transition of screen resolution of the shift register in FIG. 5 under another operation mode.

Embodiments of the present disclosure provide an operation mode of a shift register that can reduce the resolution of the mobile telephone. FIG. 9 shows schematically a transition of screen resolution of the shift register 500 in FIG. 5 under another operation mode. As shown in FIG. 9, by adjusting the timing sequence of signals of the shift register 500, two rows of gate lines are turned on at the same time, that is, two rows of pixels are charged at the same time, which may save power consumption of the screen. At the same time, in conjunction with ICs and the cooperation of the mobile telephone side, it is possible to convert a picture with a resolution of 3840 rows×2160 columns into a picture displayed with a resolution of 1920 rows×1080 columns, which can significantly reduce the power consumption of the screen.

Figure 10:
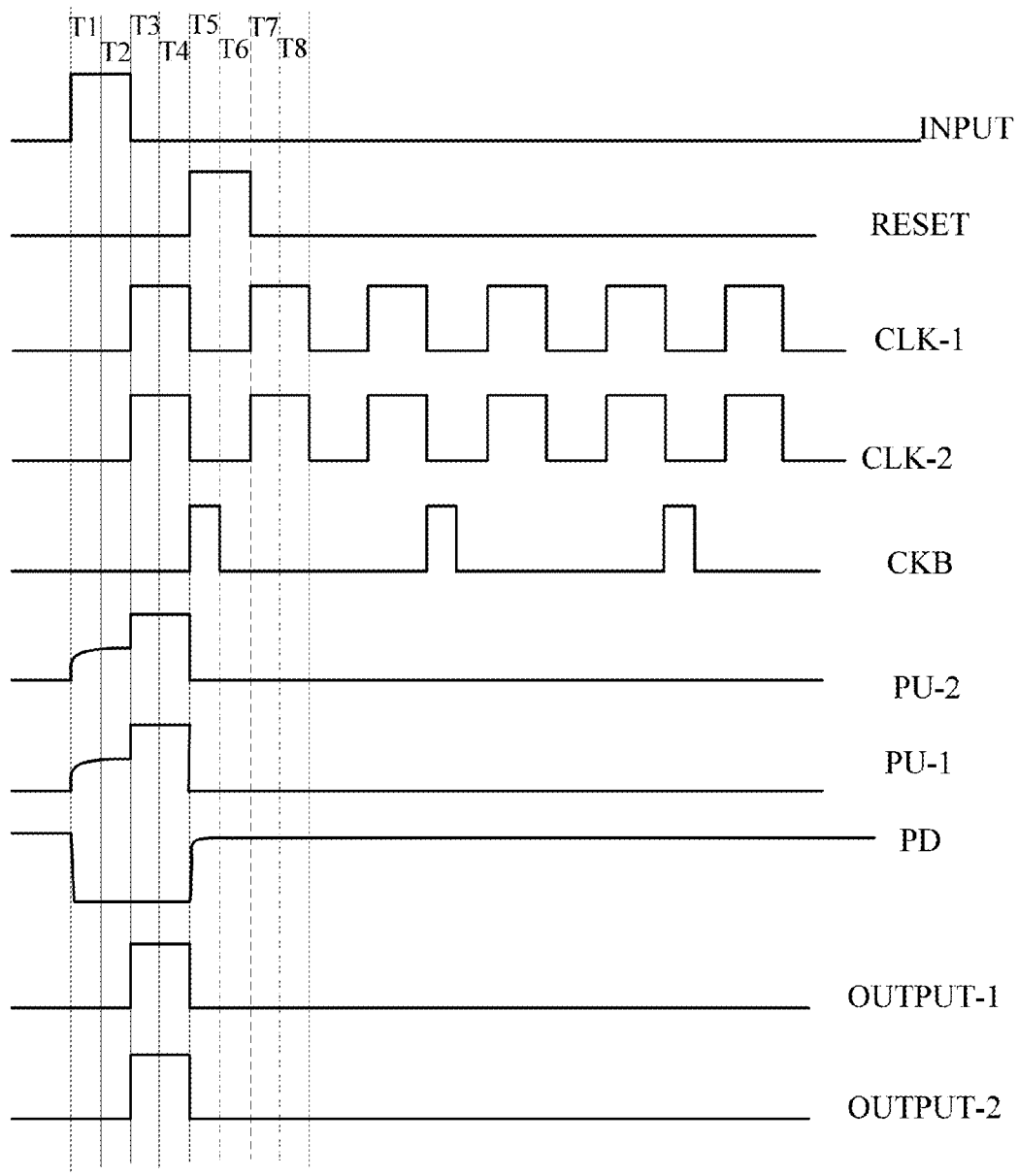
FIG. 10 shows a timing sequence diagram of signals while the shift register is canning forwardly under the operation mode of FIG. 9 according to an embodiment of the present disclosure.

FIG. 10 shows a timing sequence diagram of signals when the shift register 500 is scanning forwardly under the operation mode of FIG. 9 according to an embodiment of the present disclosure.

As shown in FIG. 10, during one frame, the operation process includes the following phases. The operation process will be described below with reference to FIGS. 5 and 10.

A first phase T1. By the reset control unit 520 and the output control unit 530, the first signal output terminal OUTPUT-1 and the second signal output terminal OUTPUT-2 of the shift register 500 both output low level signals. The start signal STV input from the signal input terminal INPUT is a high level signal, and low level signals are input to all of the reset signal terminal RESET, the reset clock signal input terminal CKB, the first clock signal input terminal CLK-1 and the second clock signal input terminal CLK-2. The first transistor M1 is turned on, the second transistor M2 is not turned on, a high level signal input from the first power input terminal CN pulls up the voltage level of the pull-up node PU. The third transistor M3 is not turned on, which does not have influence on the voltage level of the pull-down node PD. The pull-up node PU is of a high voltage level which turns on the transistor M5, and then the voltage level of the pull-down node PD is pulled down. The high voltage source VGH turns on both the pull-up control transistor M11 of the first pull-up unit 531-1 and the pull-up control transistor M21 of the second pull-up unit 531-2, thereby pulling up the voltage levels of the first node PU-1 and the second node PU-2. The pull-up transistor M12 of the first pull-up unit 531-1 and the pull-up transistor M22 of the second pull-up unit 531-2 are both turned on to provide the low level signals inputted at the first clock signal input terminal CLK-1 and the second clock signal input terminal CLK-2 to the first signal output terminal OUTPUT-1 and the second signal output terminal OUTPUT-2, respectively.

A second phase T2. By the reset control unit 520 and the output control unit 530, the first signal output terminal OUTPUT-1 and the second signal output terminal OUTPUT-2 of the shift register 500 both output low level signals. The start signal STV input from the signal input terminal INPUT is a high level signal, and low level signals are input to all of the reset signal terminal RESET, the reset clock signal input terminal CKB, the first clock signal input terminal CLK-1 and the second clock signal input terminal CLK-2. Signal inputs and outputs in this phase are the same as those in the first phase TI and respective signals remain unchanged.

A third phase T3. By the reset control unit 520 and the output control unit 530, both the first signal output terminal OUTPUT-1 and the second signal output terminal OUTPUT-2 of the shift register 500 output high level signals. High level signals are input from the first clock signal input terminal CLK-1 and the second clock signal input terminal CLK-2, and low level signals are input to all of the signal input terminal INPUT, the reset signal terminal RESET and the reset clock signal input terminal CKB. The voltage level of the first node PU-1 is high, and the pull-up transistor M12 of the first pull-up unit 531-1 is turned on, which provides the high level signal inputted at the first clock signal input terminal CLK-1 to the first signal output terminal OUTPUT-1. The voltage level of the second node PU-2 is high, and the pull-up transistor M22 of the second pull-up unit 531-2 is turned on, which provides the high level signal inputted at the second clock signal input terminal CLK-2 to the second signal output terminal OUTPUT-2. Due to the bootstrap function of the storage capacitor C11 of the first pull-up unit 531-1, the voltage level of the first node PU-1 is further pulled up. Due to the bootstrap function of the storage capacitor C21 of the second pull-up unit 531-2, the voltage level of the second node PU-2 is further pulled up.

A fourth phase T4. By the reset control unit 520 and the output control unit 530, the first signal output terminal OUTPUT-1 and the second signal output terminal OUTPUT-2 of the shift register 500 both output high level signals. High level signals are input from the first clock signal input terminal CLK-1 and the second clock signal input terminal CLK-2, and low level signals are input to all of the signal input terminal INPUT, the reset signal terminal RESET and the reset clock signal input terminal CKB.

Signal inputs and outputs in this phase are the same as those in the third phase T3 and respective signals remain unchanged.

A fifth phase T5. By the reset control unit 520 and the output control unit 530, the first signal output terminal OUTPUT-1 and the second signal output terminal OUTPUT-2 of the shift register 500 both output low level signals. High level signals are input from the reset signal terminal RESET and the reset clock signal input terminal CKB, and low level signals are input to all of the signal input terminal INPUT, the first clock signal input terminal CLK-1 and the second clock signal input terminal CLK-2. The second transistor M2 is turned on, and the low level signal inputted from the second power input terminal CNB pulls down the voltage level of the pull-up node PU. The high voltage source VGH turns on both the pull-up control transistor M11 of the first pull-up unit 531-1 and the pull-up control transistor M21 of the second pull-up unit 531-2, thereby pulling down the voltage levels of the first node PU-1 and the second node PU-2. The third transistor M3 is turned on, which pulls up the voltage level of the pull-down node PD. The pull-down transistor M13 of the first pull-down unit 532-1 and the pull-down transistor M23 of the second pull-down unit 532-2 are both turned on such that the first signal output terminal OUTPUT-1 and the second signal output terminal OUTPUT-2 output low level signals.

After the fifth phase T5, by the reset control unit 520 and the output control unit 530, the first signal output terminal OUTPUT-1 and the second signal output terminal OUTPUT-2 of the shift register 500 continue to output low level signals until the arrival of the next frame. The first clock signal input terminal CLK-1 inputs a high level signal in the next two phases after every interval of two phases, the second clock signal input terminal CLK-2 inputs a high level signal in the next two phases after every interval of two phases, the reset clock signal input terminal CKB inputs a high level signal in the next phase after every interval of seven phases, the reset signal terminal RESET continues to input a high level signal in a phase T6 and continues to input low level signals in a phase T7 and thereafter, and other input signals and output signals remain constant until arrival of the next frame. The shift register 500 repeats the above-mentioned phases after receiving the high level signal inputted from the signal input terminal INPUT.

As it can be seen from FIG. 10, the signal input at the first clock signal input terminal CLK-1 and the signal input at the second clock signal input terminal CLK-2 both have a duty cycle of 1:2. The signal CLK1 input at the first clock signal input terminal CLK-1 and the signal CLK2 input at the second clock signal input terminal CLK-2 begin to change to an effective level after the signal input at the signal input terminal INPUT changes from the effective level to an ineffective level.

As it can be seen from FIG. 10, the signal input at the reset clock signal input terminal CKB has a duty cycle of 1:8. The signal input at the reset clock signal input terminal CKB begins to become an effective level after the signal input at the second clock signal input terminal CLK-2 changes from the effective level to the ineffective level.

A specific operation process of the shift register 500 according to the present disclosure upon reverse scanning in the operation mode in FIG. 9 is similar to that upon forward scanning and will not be described any more herein.

Figure 11:
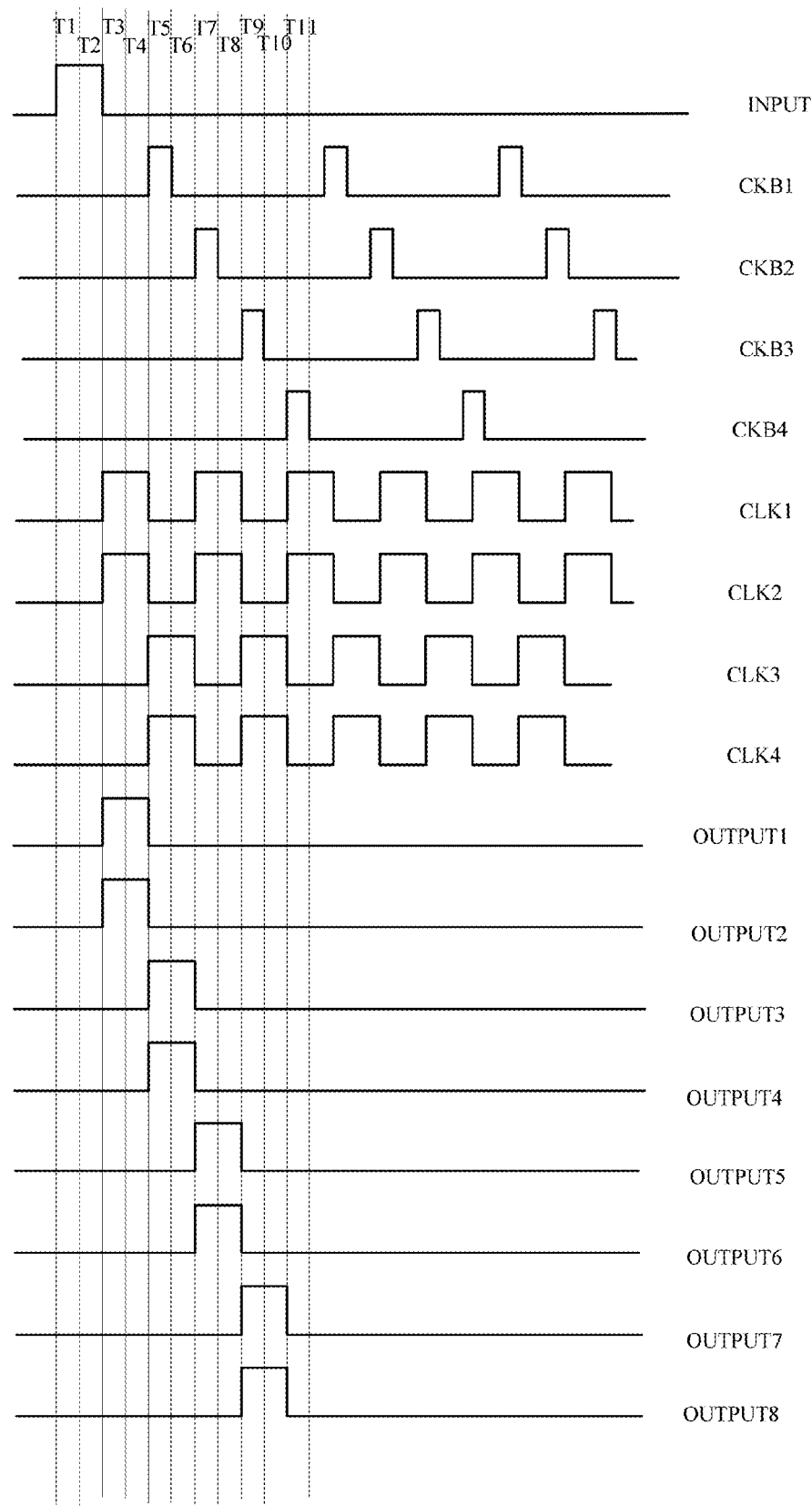
FIG. 11 shows a timing sequence diagram of signals while the gate driving device of FIG. 7 is scanning forwardly under the operation mode of FIG. 9.

FIG. 11 shows a timing sequence diagram of signals when the gate driving device of FIG. 7 is scanning forwardly under the operation mode of FIG. 9.

As shown in FIG. 7, in the gate driving device, every two shift registers are of a group that is input with a group of clock signals CLK1 to CLK4. For example, a clock signal CLK1 is input at the first clock signal input terminal CLK-1 of the first shift register R1, a clock signal CLK2 is input at the second clock signal input terminal CLK-2, a clock signal CLK3 is input at the first clock signal input terminal CLK-1 of the second shift register R2, and a clock signal CLK4 is input at the second clock signal input terminal CLK-2.

As shown in FIG. 7, in the gate driving device, every four shift registers are of a group and a group of reset clock signals CKB1 to CKB4 are input from the reset clock signal input terminal CKB of the shift registers. For example, a reset clock signal CKB1 is input at the reset clock signal input terminal CKB of the first shift register R1, a reset clock signal CKB2 is input at the reset clock signal input terminal CKB of the second shift register R2, a reset clock signal CKB3 is input at the reset clock signal input terminal CKB of the third shift register R3, and a reset clock signal CKB4 is input at the reset clock signal input terminal CKB of the fourth shift register R4.

For simplicity, the gate driving device including 4 shift registers will be described as an example in FIG. 11. As shown in FIG. 11, under the control of clock signals and reset clock signals, the first signal output terminals and the second signal output terminals of the shift registers R1 to R4 output signals OUTPUT1 to OUTPUT8 successively.

As it can be seen from FIG. 11, the signals CLK1 to CLK4 input from the first clock signal input terminals CLK-1 and the second clock signal input terminals CLK2 of two adjacent shift registers each have a duty cycle of 1:2. After the signal input at the signal input terminal INPUT changes from an effective level to an ineffective level, the signal CLK1 input at the first clock signal input terminal CLK-1 of the first shift register and the signal CLK2 input at the second clock signal input terminal CLK-2 of the first shift register begin to change to an effective level. After the signal CLK1 input at the first clock signal input terminal CLK-1 of the first shift register and the signal CLK2 input at the second clock signal input terminal CLK-2 of the first shift register change from the effective level to the ineffective level e, the signal CLK3 input at the first clock signal input terminal CLK-1 of the second shift register and the signal CLK4 input at the second clock signal input terminal CLK-2 of the second shift register begin to change to the effective level.

As it can be seen from FIG. 11, reset clock signals CKB1 to CKB4 input at the reset clock signal input terminals CKB of four adjacent shift registers have a duty cycle of 1:8. After the signal input at the second clock signal input terminal CLK-2 of each shift register in four adjacent shift registers changes from the effective level to the ineffective level, the reset clock signal input at the reset clock signal input terminal CKB of the same stage of the shift register begins to become the effective level.

A specific operation process of the shift registers R1 to R4 of the gate driving device according to an embodiment of the present disclosure upon forward scanning in the operation mode of FIG. 9 is similar to that described with reference to FIGS. 5 and 10 and will not be described any more here.

A specific operation process of the gate driving device according to an embodiment of the present disclosure upon reverse scanning in the operation mode in FIG. 9 is similar to that upon forward scanning and will not be described any more herein.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.)

The present application claims the priority of the Chinese Patent Application No. 201510477391.0 filed on Aug. 6, 2015, which is incorporated herein by reference in its entirety as part of the disclosure of the present application.

The invention claimed is:

1. A shift register comprising:
a scanning direction selecting unit connected with a first power input terminal, a second power input terminal, a signal input terminal and a reset signal terminal, and configured to provide an input signal of the signal input terminal to a pull-up node under a control of a voltage inputted at the first power input terminal, or to provide an input signal at the reset signal terminal to the pull-up node under a control of a voltage inputted at the second power input terminal, the pull-up node being an output node of the scanning direction selecting unit;
a reset control unit with an input terminal connected with the pull-up node, a reset clock signal input terminal and a low voltage source, the reset control unit being configured to pull down a voltage level of the pull-up node according to a signal at the reset clock signal input terminal and to provide a reset control signal at a pull-down node, the pull-down node being an output node of the reset control unit;
an output control unit connected with the pull-up node, the pull-down node, N clock signal input terminals, the low voltage source and a high voltage source, wherein n is an integer, and N=2;
wherein the output control unit comprises:
N pull-up units, wherein an $n^{th}$ pull-up unit is connected with the pull-up node, a high voltage source, an $n^{th}$ clock signal input terminal and an $n^{th}$ pull-down unit;
N pull-down units, wherein an $n^{th}$ pull-down unit is connected with the pull-down node and the low voltage source; and
N signal output terminals,
wherein a connection point between the $n^{th}$ pull-up unit and the $n^{th}$ pull-down unit is also connected with an $n^{th}$ signal output terminal;
wherein the output control unit is configured to provide clock signals from N clock signal input terminals to the N signal output terminals respectively under a control of a voltage of the pull-up node, and pull down voltage levels of output signals of the N signal output terminals under a control of a signal provided by the pull-down node; and
wherein n is an integer, and $1 \leq n \leq N$;
wherein a signal inputted at a first clock signal input terminal and a signal inputted at a second clock signal input terminal have a duty cycle of 1:4, and a signal inputted at the first clock signal input terminal begins to become an effective level after the signal inputted at the signal input terminal changes from an effective level to an ineffective level, and the signal inputted at the second clock signal input terminal is delayed by a pulse width compared to the signal inputted at the first clock signal input terminal;
a signal inputted at the reset clock signal input terminal has a duty cycle of 1:8 and the signal inputted at the reset clock signal input terminal is delayed by the pulse width compared to the signal inputted at the second clock signal input terminal; and
the pulse width is set as needed.

2. The shift register of claim 1, wherein
upon forward scanning, a high level signal is input from the first power input terminal, and a low level signal is input from the second power input terminal;
upon reverse scanning, the low level signal is input from the first power input terminal, and the high level signal is input from the second power input terminal;
wherein the signal input terminal of the forward scanning is used as the reset signal terminal of the reverse scanning, and the reset signal terminal of the forward scanning is used as the signal input terminal of the reverse scanning.

3. The shift register of claim 1, wherein the scanning direction selecting unit comprises:
a first transistor, of which a source electrode is connected to the first power input terminal, a gate electrode is connected to the signal input terminal, and a drain electrode is connected to the pull-up node; and
a second transistor, of which a source electrode is connected to the second power input terminal, a gate electrode is connected to the reset signal terminal, and a drain electrode is connected to the pull-up node.

4. The shift register of claim 3, wherein the reset control unit comprises:
a third transistor, of which a source electrode and a gate electrode are connected with the reset clock signal input terminal and a drain electrode is connected with the pull-down node;
a fourth transistor, of which a source electrode is connected with the low voltage source, a gate electrode is connected with the pull-down node and a drain electrode is connected with the pull-up node;
a fifth transistor, of which a source electrode is connected with the low voltage source, a gate electrode is connected with the pull-up node and a drain electrode is connected with the pull-down node; and
a first capacitor, of which an end is connected with the pull-down node and another end is connected with the low voltage source.

5. The shift register of claim 1, wherein
a source electrode of a pull-up control transistor of a first pull-up unit of the output control unit is connected with the pull-up node, a gate electrode is connected with the high voltage source and a drain electrode is connected with a first node;
a source electrode of a pull-up transistor of the first pull-up unit of the output control unit is connected with the first clock signal input terminal, a gate electrode is connected with the first node, and a drain electrode is connected with the first signal output terminal;
an end of a storage capacitor of the first pull-up unit of the output control unit is connected with the first node, and another end is connected with the first signal output terminal;
a source electrode of a pull-down transistor of the first pull-down unit of the output control unit is connected with the first signal output terminal, a gate electrode is connected with the pull-down node and a drain electrode is connected with the low voltage source;
a source electrode of a pull-up control transistor of a second pull-up unit of the output control unit is connected with the pull-up node, a gate electrode is connected with the high voltage source and a drain electrode is connected with a second node;

a source electrode of a pull-up transistor of the second pull-up unit of the output control unit is connected with the second clock signal input terminal, a gate electrode is connected with the second node, and a drain electrode is connected with the second signal output terminal;

an end of a storage capacitor of the second pull-up unit of the output control unit is connected with the second node, and another end is connected with the second signal output terminal; and a source electrode of a pull-down transistor of the second pull-down unit of the output control unit is connected with the second signal output terminal, a gate electrode is connected with the pull-down node and a drain electrode is connected with the low voltage source.

6. The shift register of claim 5, wherein the transistors are N-type transistors.

7. A gate driving device comprising a plurality of shift registers connected in series, each of the shift registers is the shift register of claim 1, wherein except for a last shift register, each remaining shift register has a second signal output terminal connected with a signal input terminal of its next adjacent shift register; and except for a first shift register, each remaining shift register has a first signal output terminal connected with a reset signal terminal of its previous adjacent shift register;

upon forward scanning, a frame start signal is inputted at a signal input terminal of the first shift register; and upon reverse scanning, the frame start signal is inputted at a reset signal terminal of the last shift register;

every two shift registers are of a group in which a first clock signal is input at a first clock signal input terminal of a first shift register, and a second clock signal is input at a second clock signal input terminal of the first shift register, a third dock signal is input at a first clock signal input terminal of a second shift register and a fourth dock signal is input at a second dock signal input terminal of the second shift register;

every four shift registers are of a group and a first to fourth reset dock signals are input from reset clock signal input terminals of the shift registers respectively;

the first to fourth dock signals have a duty cycle of 1:4, and after a signal inputted at a signal input terminal changes from an effective level to an ineffective level, the first clock signal begins to change to the effective level, and the first to fourth dock signals are delayed by a pulse width successively;

the first to fourth reset dock signals have a duty cycle of 1:8, and each of the first to fourth reset dock signals is delayed by the pulse width compared to a respective dock signal inputted at the second dock signal input terminal of the same stage of a corresponding shift register respectively; and the pulse width is set as needed.

8. A method for driving the shift register according to claim 1, comprising during a frame:

in a first phase, making a first Signal output terminal and a second signal output terminal of the shift register each output a low level signal by the reset control unit and the output control unit;

in a second phase, making the first signal output terminal of the shift register output a high level signal and the second signal output terminal output the low level signal by the reset control unit and the output control unit;

in a third phase, making the first signal output terminal of the shift register output the low level signal and the second signal output terminal output the high level signal by the reset control unit and the output control unit;

in a fourth phase, making the first signal output terminal and the second signal output terminal of the shift register each output the low level signal by the reset control unit and the output control unit; and after the fourth phase, making the first signal output terminal and the second signal output terminal of the shift register continue to output the low level signal by the reset control unit and the output control unit until arrival of a next frame.

9. A method for driving the shift register according to claim 1, comprising during a frame:

in a first phase and a second phase, making a first signal output terminal and a second signal output terminal of the shift register each output a low level signal by the reset control unit and the output control unit;

in a third phase and a fourth phase, making the first signal output terminal and the second signal output terminal of the shift register each output a high level signal by the reset control unit and the output control unit;

in a fifth phase, making the first signal output terminal and the second signal output terminal of the shift register each output the low level signal by the reset control unit and the output control unit; and after the fifth phase, making the first signal output terminal and the second signal output terminal of the shift register continue to output the low level signal by the reset control unit and the output control unit until arrival of a next frame.

10. The shift register of claim 1, wherein each pull-up unit includes a pull-up control transistor, a pull-up transistor and a storage capacitor, and each pull-down unit includes a pull-down transistor.

11. The shift register of claim 10, wherein a source electrode of a pull-up control transistor of the $n^{th}$ pull-up unit is connected with the pull-up node, a gate electrode of the pull-up control transistor of the $n^{th}$ pull-up unit is connected with the high voltage source and a drain electrode of the pull-up control transistor of the $n^{th}$ pull-up unit is connected with an $n^{th}$ node;

a source electrode of a pull-up transistor of the $n^{th}$ pull-up unit is connected with an $n^{th}$ clock signal input terminal, a gate electrode of the pull-up transistor of the $n^{th}$ pull-up unit is connected with the $n^{th}$ node, and a drain electrode of the pull-up transistor of the $n^{th}$ pull-up unit is connected with the $n^{th}$ signal output terminal; and an end of a storage capacitor of the $n^{th}$ pull-up unit is connected with the $n^{th}$ node, and another end of the storage capacitor of the $n^{th}$ pull-up unit is connected with the $n^{th}$ signal output terminal.

12. The shift register of claim 1, wherein a source electrode of a pull-down transistor of the $n^{th}$ pull-down unit is connected with the $n^{th}$ signal output terminal, a gate electrode of the pull-down transistor of the $n^{th}$ pull-down unit is connected with the pull-down node, and a drain electrode of the pull-down transistor of the $n^{th}$ pull-down unit is connected with the low voltage source.

13. A shift register comprising:

a scanning direction selecting unit connected with a first power input terminal, a second power input terminal, a signal input terminal and a reset signal terminal, and configured to provide an input signal of the signal input terminal to a pull-up node under a control of a voltage inputted at the first power input terminal, or to provide an input signal at the reset signal terminal to the pull-up node under a control of a voltage inputted at the second power input terminal, the pull-up node being an output node of the scanning direction selecting unit;

a reset control unit with an input terminal connected with the pull-up node, a reset clock signal input terminal and a low voltage source, the reset control unit being configured to pull down a voltage level of the pull-up node according to a signal at the reset clock signal input terminal and to provide a reset control signal at a pull-down node, the pull-down node being an output node of the reset control unit;

an output control unit connected with the pull-up node, the pull-down node, N clock signal input terminals, the low voltage source and a high voltage source, wherein n is an integer, and N=2;

wherein the output control unit comprises:

N pull-up units, wherein an $n^{th}$ pull-up unit is connected with the pull-up node, a high voltage source, an $n^{th}$ clock signal input terminal and an $n^{th}$ pull-down unit;

N pull-down units, wherein an $n^{th}$ pull-down unit is connected with the pull-down node and the low voltage source; and N signal output terminals, wherein a connection point between the $n^{th}$ pull-up unit and the $n^{th}$ pull-down unit is also connected with an $n^{th}$ signal output terminal;

wherein the output control unit is configured to provide clock signals from N clock signal input terminals to the N signal output terminals respectively under a control of a voltage of the pull-up node, and pull down voltage levels of output signals of the N signal output terminals under a control of a signal provided by the pull-down node; and wherein n is an integer, and $1 \leq n \leq N$;

a signal inputted at a first clock signal input terminal and a signal inputted at a second clock signal input terminal have a duty cycle of 1:2, and the signal inputted at the first clock signal input terminal and the signal inputted at the second clock signal input terminal begin to become an effective level after a signal inputted at the signal input terminal changes from an effective level to an ineffective level;

a signal inputted at the reset clock signal input terminal has a duty cycle of 1:8, and the signal inputted at the reset clock signal input terminal begins to become the effective level after the signal inputted at the second clock signal input terminal changes from the effective level to the ineffective level.

14. The shift register of claim 13, wherein upon forward scanning, a high level signal is input from the first power input terminal, and a low level signal is input from the second power input terminal;

upon reverse scanning, the low level signal is input from the first power input terminal, and the high level signal is input from the second power input terminal;

wherein the signal input terminal of the forward scanning is used as the reset signal terminal of the reverse scanning, and the reset signal terminal of the forward scanning is used as the signal input terminal of the reverse scanning.

15. The shift register of claim 13, wherein the scanning direction selecting unit comprises:

a first transistor, of which a source electrode is connected to the first power input terminal, a gate electrode is connected to the signal input terminal, and a drain electrode is connected to the pull-up node; and a second transistor, of which a source electrode is connected to the second power input terminal, a gate electrode is connected to the reset signal terminal, and a drain electrode is connected to the pull-up node.

16. The shift register of claim 15, wherein the reset control unit comprises:

a third transistor, of which a source electrode and a gate electrode are connected with the reset clock signal input terminal and a drain electrode is connected with the pull-down node;

a fourth transistor, of which a source electrode is connected with the low voltage source, a gate electrode is connected with the pull-down node and a drain electrode is connected with the pull-up node;

a fifth transistor, of which a source electrode is connected with the low voltage source, a gate electrode is connected with the pull-up node and a drain electrode is connected with the pull-down node; and a first capacitor, of which an end is connected with the pull-down node and another end is connected with the low voltage source.

17. The shift register of claim 13, wherein a source electrode of a pull-up control transistor of a first pull-up unit of the output control unit is connected with the pull-up node, a gate electrode is connected with the high voltage source and a drain electrode is connected with a first node;

a source electrode of a pull-up transistor of the first pull-up unit of the output control unit is connected with the first clock signal input terminal, a gate electrode is connected with the first node, and a drain electrode is connected with the first signal output terminal;

an end of a storage capacitor of the first pull-up unit of the output control unit is connected with the first node, and another end is connected with the first signal output terminal;

a source electrode of a pull-down transistor of the first pull-down unit of the output control unit is connected with the first signal output terminal, a gate electrode is connected with the pull-down node and a drain electrode is connected with the low voltage source;

a source electrode of a pull-up control transistor of a second pull-up unit of the output control unit is connected with the pull-up node, a gate electrode is connected with the high voltage source and a drain electrode is connected with a second node;

a source electrode of a pull-up transistor of the second pull-up unit of the output control unit is connected with the second clock signal input terminal, a gate electrode is connected with the second node, and a drain electrode is connected with the second signal output terminal;

an end of a storage capacitor of the second pull-up unit of the output control unit is connected with the second node, and another end is connected with the second signal output terminal; and a source electrode of a pull-down transistor of the second pull-down unit of the output control unit is connected with the second signal output terminal, a gate electrode is connected with the pull-down node and a drain electrode is connected with the low voltage source.

18. The shift register of claim 17, wherein the transistors are N-type transistors.

19. A gate driving device comprising a plurality of shift registers connected in series, each of the shift registers is the shift register of claim 13,
- wherein except for a last shift register, each remaining shift register has a second signal output terminal connected with a signal input terminal of its next adjacent shift register; and except for a first shift register, each remaining shift register has a first signal output terminal connected with a reset signal terminal of its previous adjacent shift register;
- upon forward scanning, a frame start signal is inputted at a signal input terminal of the first shift register; and upon reverse scanning, the frame start signal is inputted at a reset signal terminal of the last shift register;
- every two shift registers are of a group in which a first clock signal is input at a first clock signal input terminal of a first shift register, and a second clock signal is input at a second clock signal input terminal of the first shift register, a third clock signal is input at a first clock signal input terminal of a second shift register and a fourth clock signal is input at a second clock signal input terminal of the second shift register;
- every four shift registers are of a group and a first to fourth reset clock signals are input from reset clock signal input terminals of the shift registers respectively;
- the first to fourth clock signals have a duty cycle of 1:2;
- after a signal inputted at a signal input terminal of a first shift register of two adjacent shift registers changes from an effective level to an ineffective level, a signal inputted at the first clock signal input terminal of the first shift register and a signal inputted at the second dock signal input terminal of the first shift register begin to change to the effective level; and after the signal inputted at the first dock signal input terminal of the first shift register and the signal inputted at the second dock signal input terminal of the first shift register change from the effective level to the ineffective level, a signal inputted at the first dock signal input terminal of the second shift register and a signal inputted at the second clock signal input terminal of the second register begin to change to the effective level;
- the first to fourth reset clock signals have a duty cycle of 1:8, and in the four adjacent shift registers, after the signal inputted at the second clock signal input terminal of each shift register changes from the effective level to the ineffective level, a reset clock signal input at a reset clock signal input terminal of the same stage of the corresponding shift register begins to change to the effective level.

20. The shift register of claim 13, wherein each pull-up unit includes a pull-up control transistor, a pull-up transistor and a storage capacitor, and each pull-down unit includes a pull-down transistor.

* * * * *